US012772466B2

(12) United States Patent
Chou et al.

(10) Patent No.: US 12,772,466 B2
(45) Date of Patent: Oct. 20, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Shih-Cheng Chou, Hsinchu (TW); Wei-Zhong Chen, Taipei (TW); Szu-Ping Tung, Taipei (TW); Hsiao-Kuan Wei, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 496 days.

(21) Appl. No.: 18/351,877

(22) Filed: Jul. 13, 2023

(65) Prior Publication Data

US 2025/0022911 A1 Jan. 16, 2025

(51) Int. Cl.
*H10D 1/00* (2025.01)
*H10D 1/68* (2025.01)

(52) U.S. Cl.
CPC ............. *H10D 1/042* (2025.01); *H10D 1/692* (2025.01); *H10D 1/716* (2025.01); *H10D 1/041* (2025.01)

(58) Field of Classification Search
CPC ........ H10D 1/711; H10D 1/692; H10D 1/042; H10D 1/041
See application file for complete search history.

(56) References Cited

U.S. PATENT DOCUMENTS

2021/0376058 A1* 12/2021 Shen ..................... H10B 12/03

* cited by examiner

*Primary Examiner* — Jose R Diaz
(74) *Attorney, Agent, or Firm* — Ingrassia Fisher & Lorenz, LLP | IF&L

(57) ABSTRACT

A fabrication method includes: forming, above a substrate, a first electrode having a varying density that increases from a first density level at a bottom surface of the first electrode to a second density level that is higher than the first density level at a top surface of the first electrode; forming a high-K dielectric layer over the first electrode; and forming a second electrode over the HK dielectric layer having a varying density that increases from a third density level at a bottom surface of the second electrode that bonds to the HK dielectric layer to a fourth density level that is higher than the third density level at a top surface of the second electrode.

20 Claims, 8 Drawing Sheets

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

One type of capacitor is a metal-insulator-metal (MIM) capacitor, which is used in mixed signal devices and logic devices, such as embedded memories and radio frequency devices. Metal-insulator-metal capacitors are used to store charges in a variety of semiconductor devices. A metal-insulator-metal capacitor is formed horizontally on a semiconductor wafer, with two metal plates or electrodes sandwiching a dielectric layer parallel to the wafer surface. However, there are many challenges related to the MIM capacitor.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
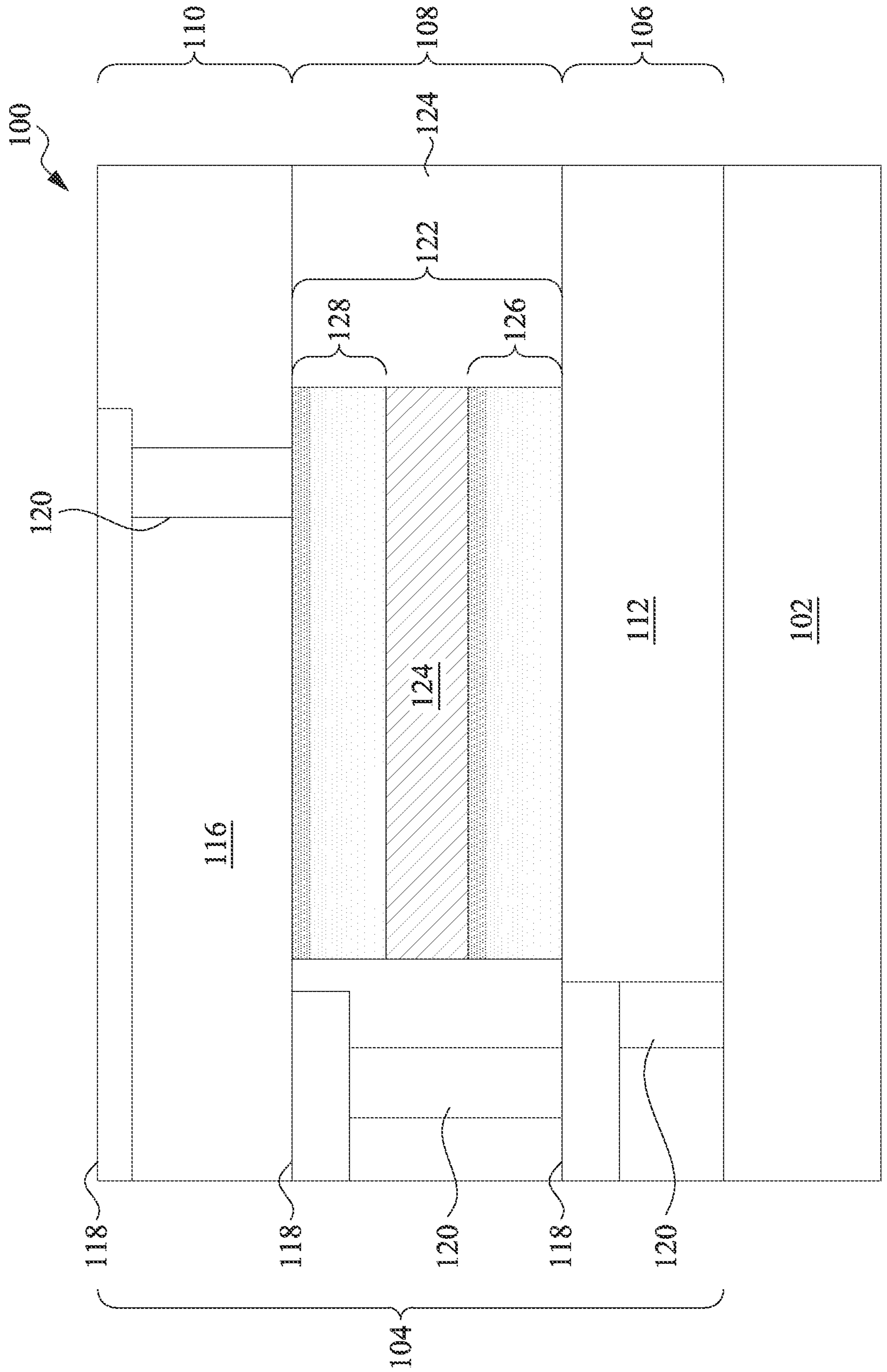
FIG. 1 depicts a cross-sectional view of an example portion of a semiconductor device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to “one embodiment,” “an embodiment,” “an example embodiment,” “exemplary,” “example,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The following disclosure provides many different embodiments, or examples, for implementing different features of the disclosed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

FIG. 1 depicts a cross-sectional view of an example portion of a semiconductor device 100. that includes a metal-insulator-metal (MIM) capacitor structure, in accordance with various embodiments. The example semiconductor device 100 includes a substrate 102 and an interconnect structure 104.

The substrate 102 may be a semiconductor substrate, such as a bulk semiconductor, a semiconductor-on-insulator (SOI) substrate, a semiconductor wafer, or the like, which may be doped (e.g., with a p-type or an n-type dopant) or undoped. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 102 can include any number of conductive features and device elements formed in and/or over the semiconductor substrate. Conductive features can include, for example, plugs, interconnects, wiring lines, etc. Device elements can include, for example, transistors, diodes, capacitors, etc. For example, the transistors may be metal oxide semiconductor field effect transistors (MOSFETs), complementary metal oxide semiconductor (CMOS) transistors, bipolar junction transistors (BJT), high-voltage transistors, high-frequency transistors, p-channel field effect transistors (PFETs) and/or n-channel field effect transistors (NFETs), diodes, or other suitable elements. The substrate 102 may further include isolation features (not shown), such as shallow trench isolation (STI) features or local oxidation of silicon (LOCOS) features. The isolation features may define and isolate the various device elements.

The interconnect structure 104 provides routing and electrical connections between devices elements formed in and/or over the substrate 102. The interconnect structure 104 may include a plurality of insulating layers (a first insulating layer 106, a second insulating layer 108, and a third insulating layer 110 are shown in this example). The example first, second, and third insulating layers 106, 108, 110 include a first inter-metal dielectric (IMD) layer 112, a second IMD layer 114, and a third IMD layer 116, respectively, and one or more conductive features, which in this example include metal lines 118 and/or vias 120 formed therein in a metallization layer. The conductive features may be electrically connected to active and/or passive devices of the substrate 102 by contacts (not shown in the figures).

In some embodiments, the interconnect structure 104 may be formed using a single and/or a dual damascene process, a VIA-first process, or a metal-first process. In an embodiment, insulating layers and openings (not shown) may be formed therein using acceptable photolithography and etching techniques. The first, second, and third IMD layers 112, 114, 116 may, for example, be or comprise an oxide film, such as silicon oxide, undoped silicon glass (USG), fluorosilicate glass (FSG), boron doped silicate glass (BSG), phosphosilicate glass (PSG), boron phosphorous-doped silicate glass (BPSG), polyethylene oxide (PEOX), thermal oxide, silicon dioxide (SiO2), or another suitable dielectric material. One or more of the IMD layers 112, 114, 116 may be made of low dielectric constant (low-k) materials, such as a dielectric constant of less than about 3.0, or less than about 2.5.

Conductive material for the metal lines 118 and/or vias 120 may be formed in the openings in the IMD layers from conductive material, such as copper (Cu), aluminum (Al), tungsten (W), nickel, cobalt, silver, combinations thereof, or other applicable materials, and may be formed in the openings using an electro-chemical plating process, chemical vapor deposition (CVD), atomic layer deposition (ALD), physical vapor deposition (PVD), the like, or a combination thereof. After formation of the conductive material, excess conductive material may be removed using, for example, a planarization process such as chemical mechanical polishing (CMP), thereby leaving conductive features in the openings of an insulating layer. The process may then be repeated to form additional insulating layers and conductive features therein. The interconnect structure 104 shown in FIG. 1 is merely for illustrative purposes. The interconnect structure 104 may include other configurations and may include one or more metal lines and IMD layers.

The example interconnect structure 104 also includes a MIM capacitor 122 formed over an IMD layer and over the substrate 102. The example MIM capacitor 122 has a sandwich structure wherein an insulating layer 124 is formed between a capacitor bottom metal (CBM) layer 126 and a capacitor top metal (CTM) layer 128. In various embodiments, the CBM layer 126 and the CTM layer 128 are formed from a metal such as titanium nitride (TiN), and the insulating layer 124 is formed from a high permittivity (high-k) dielectric material (e.g., with a relative permittivity greater than about 3). High-K dielectric materials, as used and described herein, include dielectric materials having a high dielectric constant, for example, greater than that of thermal silicon oxide (~3.9). The insulating layer 124 may include a high-K dielectric layer such as hafnium oxide (HfO2). Alternatively, the High-K dielectric layer may include other high-K dielectrics, such as TiO2, HfZrO, Ta2O3, HfSiO4, ZrO2, ZrSiO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr) TiO3 (BST), Al2O3, Si3N4, oxynitrides (SiON), combinations thereof, or other suitable material. The high-K material dielectric layer may be formed by ALD, physical vapor deposition (PVD), CVD, chemical oxidation, thermal oxidation, and/or other suitable methods.

In various embodiments, the CBM layer 126 and the CTM layer 128 are formed by PVD using magnetron sputtering. Magnetron sputtering is a deposition technology involving a gaseous plasma which is generated and confined to a space containing the material to be deposited—the 'target'. The surface of the target is eroded by high-energy ions within the plasma, and the liberated atoms travel through the vacuum environment and deposit onto a substrate to form a thin film. To initiate plasma generation, high voltage is applied between a cathode—commonly located directly behind the sputtering target—and an anode—commonly connected to the PVD chamber as electrical ground. Electrons which are present in the sputtering gas are accelerated away from the cathode causing collisions with nearby atoms of sputtering gas. These collisions cause an electrostatic repulsion which 'knock off' electrons from the sputtering gas atoms, causing ionization. The positive sputter gas atoms are now accelerated towards the negatively charged cathode, leading to high energy collisions with the surface of the target. Each of these collisions can cause atoms at the surface of the target to be ejected into the vacuum environment with enough kinetic energy to reach the surface of the substrate.

During fabrication of a MIM capacitor, interface intermixing and interdiffusion between TiN from the CTM layer 128 and High-K material from the insulating layer 124 may occur, which can deteriorate the reliability of the MIM capacitor. Intermixing involves the mixing of the TIN and the high-K material at the interface between the two materials during the deposition of the TIN. This intermixing can cause damage to the high-K layer and suboptimal device performance. Interdiffusion can result during use of a device having a high-K and TiN interface wherein the material heat up during usage and results in the two materials diffusing together at the interface between the two materials. To reduce the likelihood and negative impact of interface intermixing and interdiffusion, to improve the reliability of MIM capacitors, and to provide the capability to fine tune mechanical properties, electrical properties, uniformity, and conformity of the TIN electrodes (CBM layer 126 and CTM layer 128), a multi-step bias power scheme can be employed to form the CBM layer 126 and CTM layer 128.

Figure 2A:
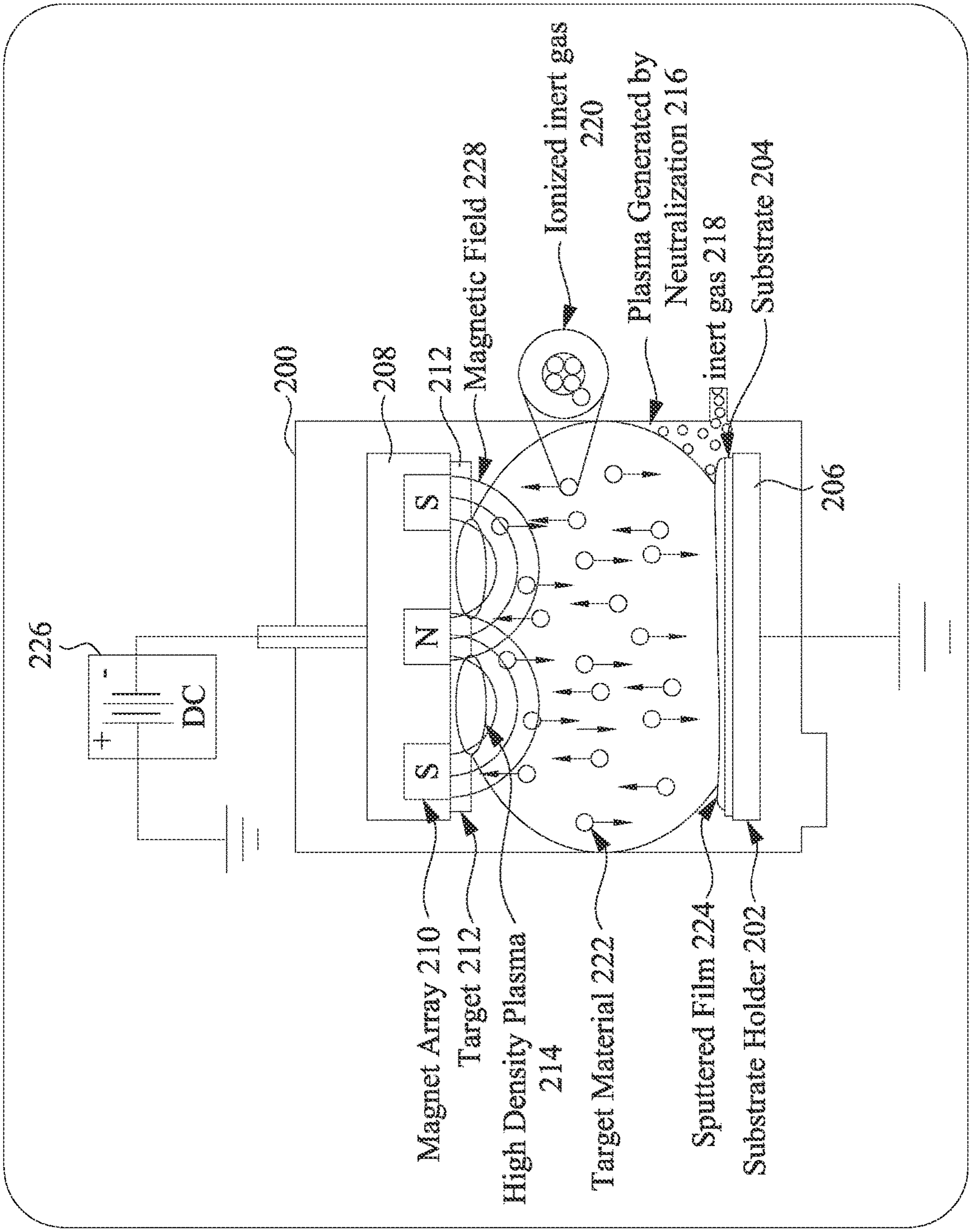
FIG. 2A is a block diagram illustrating an example process chamber for fabricating an example MIM capacitor in accordance with various embodiments.

FIG. 2A is a block diagram illustrating an example process chamber 200 for fabricating an example MIM capacitor in accordance with various embodiments. Certain details and features have been left out of FIG. 2A that are apparent to a person of ordinary skill in the art. The example process chamber 200 includes a substrate holder 202, substrate 204, an anode 206, a cathode 208, a magnet array 210, a target source material 212, high density plasma 214, plasma 216 generated by neutralization, a source of inert gas (e.g., argon) 218, inert gas ions 220, target material particles 222, and sputtered film 224. The example process chamber 200 is a PVD process chamber. A target source material 212 comprising Titanium (Ti) is situated in the process chamber 200. The target source material 212 provides a source of Ti atoms that are combined with nitrogen to form the TIN electrodes (e.g., CBM layer 126 and CTM layer 128), for the MIM capacitor 122. The substrate holder 202 is also situated in process chamber 200 and can be an electrostatic chuck for providing a platform for the substrate 204. The substrate 204 is situated on the substrate holder 202 on which a MIM capacitor, such as MIM capacitor 122 is fabricated. An inert gas line 218 such as an Argon gas line is situated in a sidewall of the process chamber for providing a source of inert gas, which can be utilized to initiate a sputtering process to dislodge Ti atoms from the target source material 212 during formation of TiN electrodes (e.g., CBM layer 126 and CTM layer 128).

In one example, the sputtering process begins when a substrate 204 to be coated is placed in a process chamber 200 containing an inert gas—usually Argon—and a negative charge 226 is applied to a target source material 212 that will be deposited onto the substrate 204 causing the plasma 216 to glow.

Free electrons flow from the negatively charged target source material 212 in the plasma environment, colliding with the outer electronic shell of the Argon gas atoms driving these electrons off due to their like charge. The inert gas atoms become positively charged ions 220 attracted to the negatively charged target material 212 at a very high velocity that "Sputters off" atomic size particles 222 from the target source material 212 due to the momentum of the collisions. These particles 222 cross the process chamber 200 of the sputter coater and are deposited as a thin film 224 of material on the surface of the substrate 204 to be coated.

The number of atoms ejected or "Sputtered off" from the target source material 212 or source material is called the sputter yield. The sputter yield varies and can be controlled by the energy and incident of angle of the bombarding ions 220, the relative masses of the ions and target atoms, and the surface binding energy of the target atoms.

Because ions 220 are charged particles, magnetic fields 228 can be used to control their velocity and behavior. Magnetron sputtering deposition uses magnets from magnet array 210 behind the negative cathode 208 to trap electrons over the negatively charged target material 212 so they are not free to bombard the substrate 204, allowing for faster deposition rates.

Bias power applied to the process chamber 200, for example in the form of a DC sputtering power source, an RF Sputtering power source, a Pulsed DC sputtering power source, an MF sputtering power source, an AC sputtering power source, a high power impulse magnetron sputtering (HiPIMS) power source, and the like can be controlled via a biasing scheme to control the sputter yield. Controlling the sputter yield can allow for multi-step bias attunement.

Figure 2B:
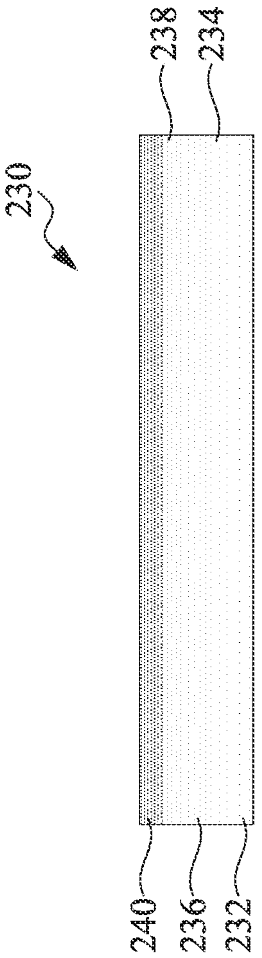
FIG. 2B depicts a cross-sectional view of an example MIM capacitor electrode that has been formed using a multi-step biasing scheme, in accordance with various embodiments.

FIG. 2B is a depicts a cross-sectional view of an example electrode 230 (e.g., a TiN electrode) that has been formed using multi-step attunement. Multi-step attunement, as used herein, involves forming, an electrode (e.g., a TiN electrode) having a varying density that increases from a first density level at a bottom surface of the electrode, to a second density level that is higher than the first density level at an intermediary area within the electrode, and to a higher density level that is higher than the second density level at a top surface of the electrode. In the example of FIG. 2B, the electrode 230 has five density levels. In other examples, other numbers of density levels may be formed, such as three or greater.

The example electrode 230 has a first area 232 at a first density level, a second area 234 at a second density level that is higher than the first density level, a third area 236 at a third density level that is higher than the second density level, a fourth area 238 at a fourth density level that is higher than the third density level, and a fifth area 240 at a fifth density level that is higher than the fourth density level. The example electrode 230 may be formed in a PVD process chamber (such as process chamber 200) via plasma-based PVD techniques. The PVD process chamber uses a power source (such as a DC sputtering power source, an RF Sputtering power source, a Pulsed DC sputtering power source, an MF sputtering power source, an AC sputtering power source, and a high power impulse magnetron sputtering (HiPIMS) power source) to cause magnetron sputtering at increasing sputtering yields as the magnetron sputtering continues.

In this example, during a first time period, when the first area 232 is formed, a bias power applied in the process chamber to the magnetron cathode is at a first level. During a second time period, when the second area 234 is formed, the bias power applied in the process chamber to the magnetron cathode is at a second level that is higher than the first level. During a third time period, when the third area 236 is formed, the bias power applied in the process chamber to the magnetron cathode is at a third level that is higher than the second level. During a fourth time period, when the fourth area 238 is formed, the bias power applied in the process chamber to the magnetron cathode is at a fourth level that is higher than the third level. During a fifth time period, when the fifth area 240 is formed, the bias power applied in the process chamber to the magnetron cathode is at a fifth level that is higher than the fourth level.

In various embodiments, the bias power range can be 0 W to 250 W, and the TIN thickness can be from 0 A to 700 A. In various embodiments, every thickness area can have a constant bias or varying bias.

Figure 3A:
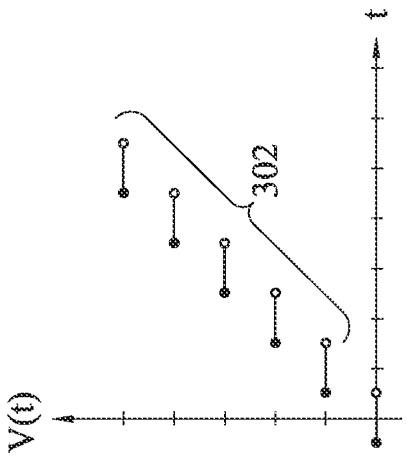
FIGS. 3A-3C depict graphs of various biasing power schemes that may be applied by a power source in a process chamber to cause magnetron sputtering at increasing sputtering yields, in accordance with various embodiments.
Figure 3B:
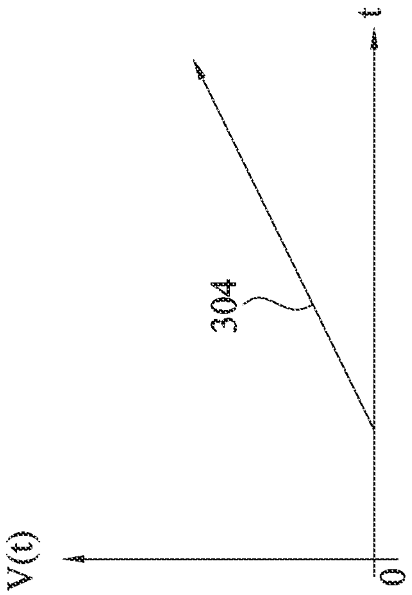
Figure 3C:
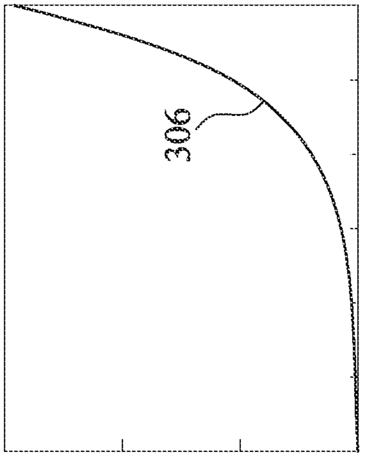

FIGS. 3A-3C depict graphs of varying bias power levels that may be applied by a power source in a process chamber to cause magnetron sputtering at increasing sputtering yields. In the example of FIG. 3A, a bias power scheme employed in a process chamber comprises applying step increases 302 to increase the bias power. This may result in the formation of an electrode, such as example electrode 230, with discrete electrode areas with discrete density levels that increase as you move from the bottom of the electrode to the top of the electrode. Although the example of FIG. 3A shows equal voltage level increases over equal time increments, the amount of power increase may not be equal in magnitude in other examples, and the time increments may not be equal in magnitude in other examples.

In the example of FIG. 3B, a bias power scheme employed in a process chamber comprises bias power 304 ramping up in a linear manner. This may result in the formation of an electrode with continuously increasing density levels as you move from the bottom of the electrode to the top of the electrode. Although the example of FIG. 3B shows the slope of voltage level increases to be the same over equal time increments, the slope of power increase may not be equal in value in equal time increments in other examples, and the time increments may not be equal in value in other examples.

In the example of FIG. 3C, a bias power scheme employed in a process chamber comprises bias power 306 increasing in an exponential manner. This may result in the formation of an electrode with density levels that increase in an exponential manner as you move from the bottom of the electrode to the top of the electrode.

Although the examples of FIGS. 3A-3C show bias power increasing either in a step-wise manner, linear manner, or exponential manner, in other examples, the bias power may be increased in a combination of two or more of a step-wise manner, linear manner, and exponential manner. Other power schemes may also be employed to cause bias power to increase during TiN formation thus resulting in a TiN layer being deposited with varying density.

In various embodiments, the bias power scheme can be controlled to achieve desired mechanical properties, desired electrical properties, desired uniformity properties, and/or desired conformity properties of the deposited metal layer (e.g., TiN layer). In various embodiments, the bias power scheme can be controlled to achieve desired mechanical properties, such as a desired density. Higher density can result in a stronger metal layer.

In various embodiments, the bias power scheme can be controlled to achieve other desired mechanical properties, such as microstructure changes in the form of desired roughness, grain size, and others. In one example implementation using a single-step bias power scheme (e.g., a constant bias power is applied in the process chamber to deposit TiN) the deposited TiN had a grain size of 130.2 Angstroms (Å), a roughness in the center of 13.5±0.1 Å, and a roughness at the edge of 11.9±0.1 Å. In comparison, using a multi-step bias power scheme (e.g., bias power applied in the process chamber changed multiple times) with a TiN layer thickness equal to the TiN layer thickness of the TIN layer deposited using a single-step bias power scheme, the deposited TiN had a grain size of 118.0 Å, a roughness in the center of 13.6±0.2 Å, and a roughness at the edge of 10.8±0.1 Å. A smaller grain size can be achieved based on multi-step biasing. In addition, a desired roughness may be attainable using a multi-step bias power scheme.

Figure 4:
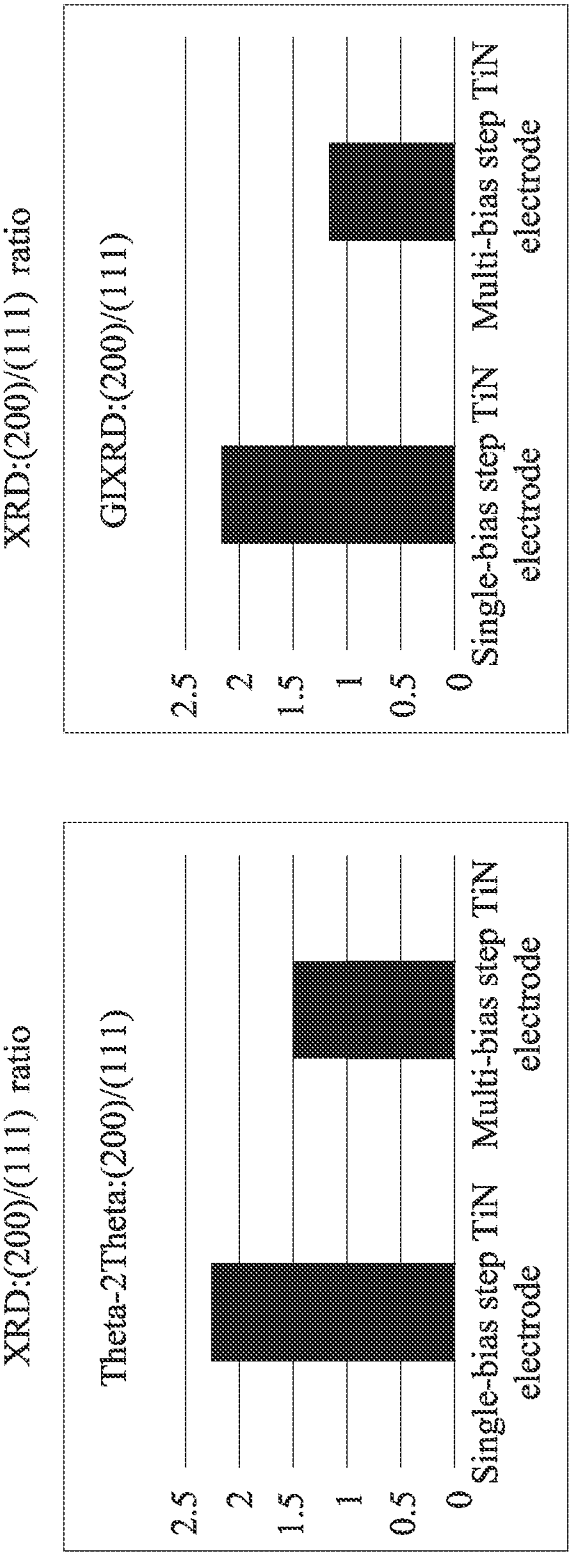
FIG. 4 depicts graphs of example crystal ratios determined using X-ray diffraction analysis (XRD) on a TiN electrode formed using a single-step biasing power scheme and on a TiN electrode formed using a multi-step biasing power scheme, in accordance with various embodiments.

In various embodiments, the bias power scheme can be controlled to achieve other microstructure changes. In one example implementation, deposition of a TiN layer over a high-K layer using multi-step biasing resulted in a (200/111) ratio of the deposited TIN that was different from the (200/111) ratio of the deposited TiN when deposited using single-step biasing. As illustrated in FIG. 4, as determined using X-ray diffraction analysis (XRD), a theta-2theta (200)/(100) ratio was over 0.2 for a TiN electrode formed using single-step biasing versus being about 0.15 for a TiN electrode formed using multi-step biasing. Also as illustrated in FIG. 4 as determined using X-ray diffraction analysis (XRD), a theta-2theta GIXRD (200)/(100) ratio was almost twice as much for a TiN electrode (ratio of ~2) formed using single-step biasing versus a TiN electrode (ratio of ~1) formed using multi-step biasing. Thus, the crystalline structure of a TiN layer can be changed using multi-step biasing. XRD is a technique used in materials science to determine the crystallographic structure of a material. XRD works by irradiating a material with incident X-rays and then measuring the intensities and scattering angles of the X-rays that leave the material.

Use of a multi-step biasing power scheme to deposit TiN may keep a stochiometric TiN composition (e.g., close to 1:1 Ti:N ratio). In one example implementation, deposition of a TiN layer over a high-K layer resulted in the atomic percentage of the Ti in the TIN of 51.59% and the atomic percentage of the N in the TIN of 48.41% as determined by an EDX line scan. When a TiN layer of the same thickness was deposited using a multi-step biasing power scheme, deposition of a TiN layer over a high-K layer resulted in the atomic percentage of the Ti in the TIN of 51.18% and the atomic percentage of the N in the TIN of 48.82% as determined by an EDX line scan.

In various embodiments, the bias power scheme can be controlled to achieve desired electrical properties, such as resistivity or plate resistance. In various embodiments, a lower resistivity or plate resistance can be achieved with the application of higher bias power in the process chamber when the metal layer (e.g., TiN layer) is patterned. Lower bias power can be applied at lower levels of the metal layer to reduce intermixing and/or interdiffusion, while higher bias power can be applied at higher levels of the metal layer to reduce resistivity or plate resistance.

In various embodiments, the bias power scheme can be controlled to achieve desired conformity properties, such as lower or higher sidewall angle magnitude. In various embodiments a lower sidewall angle magnitude can be achieved with the application of higher bias power in the process chamber when the metal layer (e.g., TiN layer) is patterned. Lower bias power can be applied at lower levels of the metal layer to reduce intermixing and/or interdiffusion, while higher bias power can be applied at higher levels of the metal layer to reduce the sidewall angle magnitude.

In various embodiments, the bias power scheme can be controlled to achieve desired uniformity properties, such as within wafer thickness uniformity, thickness range, sheet resistance uniformity, and sheet resistance range.

Figure 5:
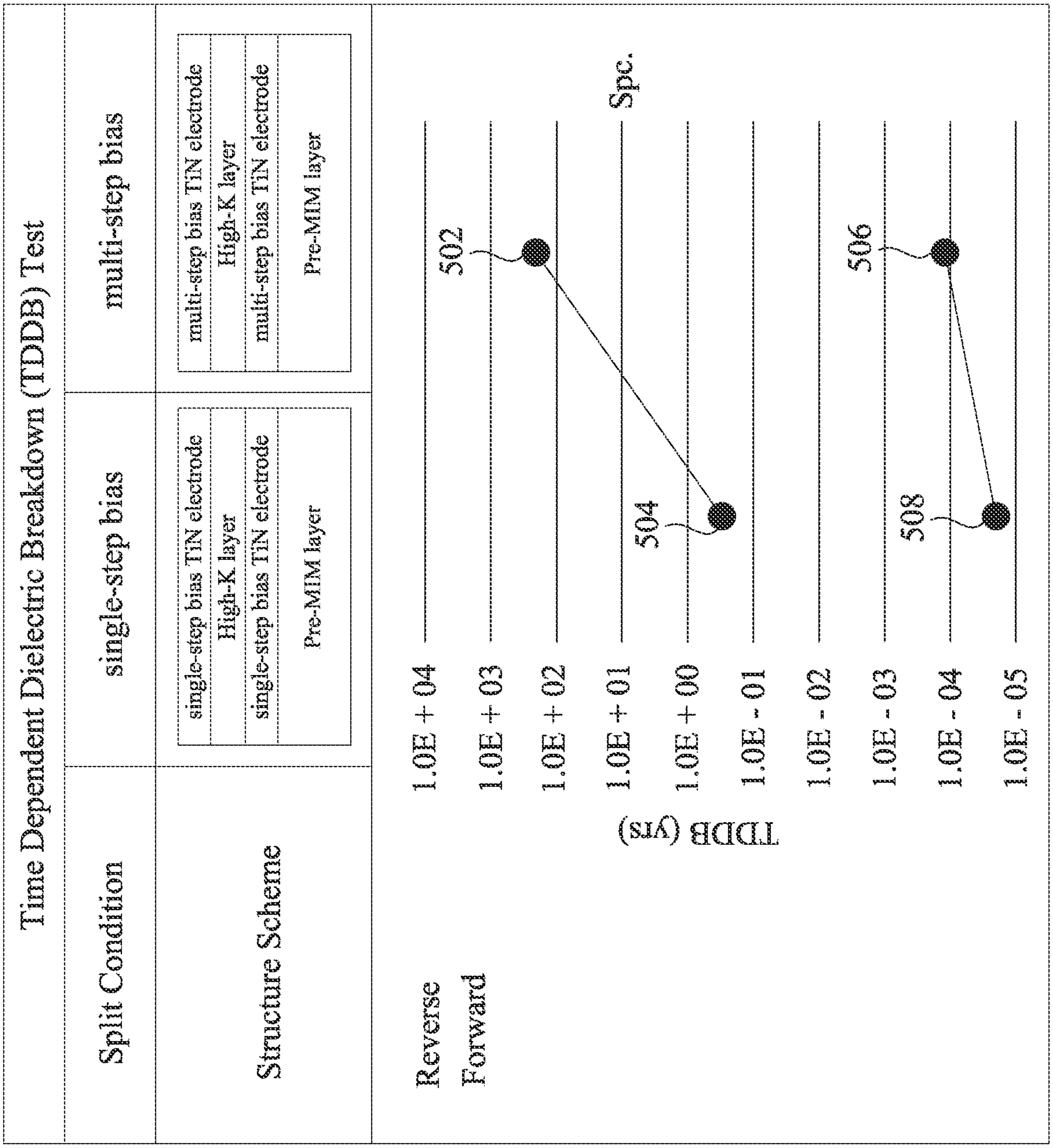
FIG. 5, depicts graphs of example time dependent dielectric breakdown (TDDB) test results for a capacitor electrode formed using a single-step biasing power scheme versus a capacitor electrode formed using a multi-step biasing power scheme, in accordance with various embodiments.

In various embodiments, the bias power scheme can be controlled to achieve improvements in device reliability. In an example implementation, as illustrated in FIG. 5, a time dependent dielectric breakdown (TDDB) test was performed to compare the reliability of a MIM capacitor with a TiN layer formed using single-step biasing versus a MIM capacitor with a TiN layer formed using multi-step biasing. In this example, 10 years of usage was a specification requirement. A reverse direction was defined as the top capacitive plate having a negative voltage applied and the bottom capacitive plate having a positive voltage applied wherein electrons moved from the top plate to the bottom plate. The TDDB value 502 for the capacitor with the TiN layer formed using multi-step biasing was much better than the TDDB value 504 for the capacitor with the TiN layer formed using single-step biasing. The improved performance was achieved because of reduced damage on the top surface of the high-K layer of the capacitor.

Also, in this example, a forward direction was defined as the top capacitive plate having a positive voltage applied and the bottom capacitive plate having a negative voltage applied wherein electrons moved from the bottom plate to the top plate. The TDDB value 506 for the capacitor with the TiN layer formed using multi-step biasing was much better than the TDDB value 508 for the capacitor with the TIN layer formed using single-step biasing. The improved performance was achieved because of reduced damage on the top surface of the high-K layer of the capacitor.

Figure 6:
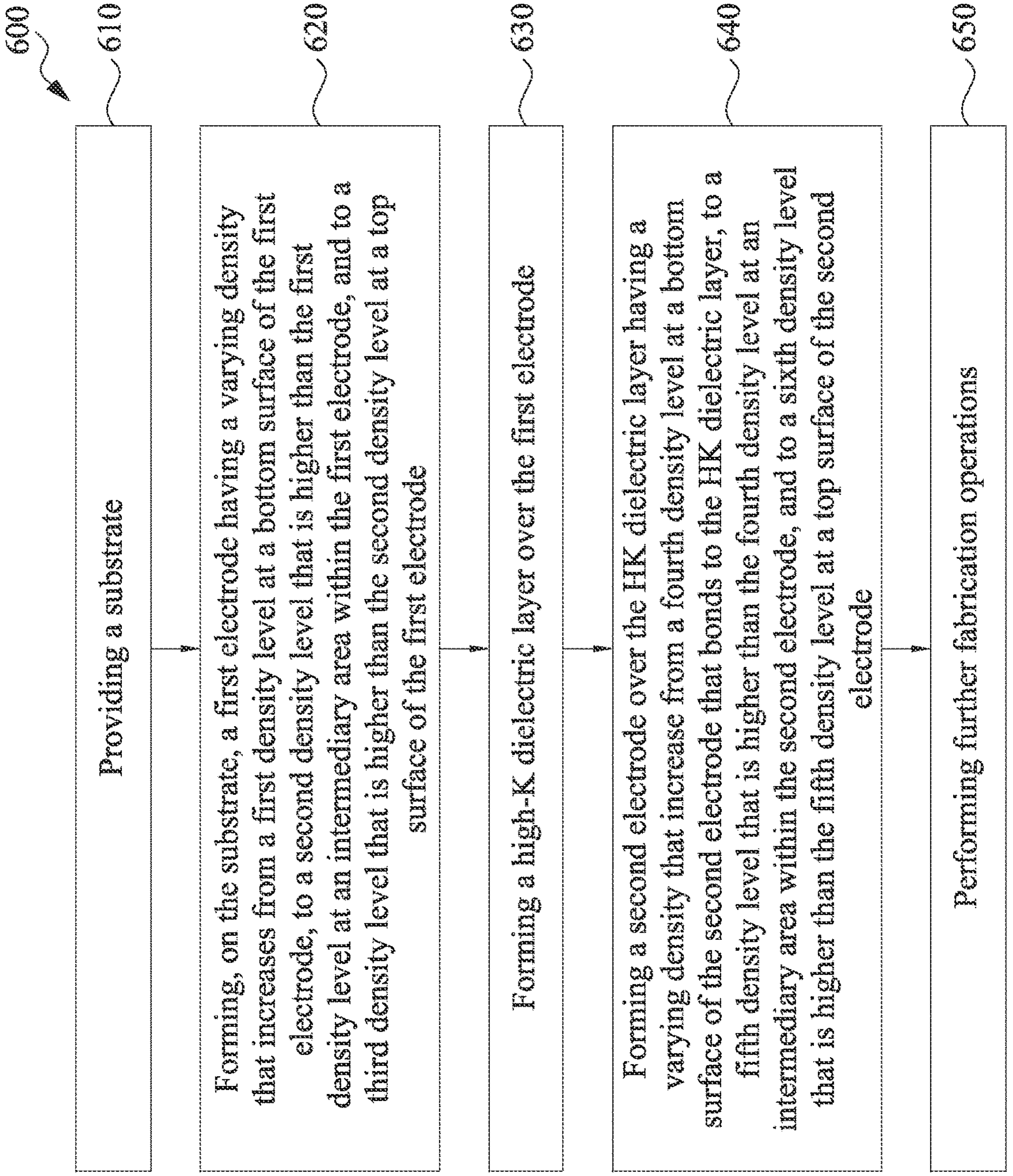
FIG. 6 is a process flow chart depicting an example process for forming a MIM capacitor using a multi-step biasing power scheme, in accordance with various embodiments.

FIG. 6 is a process flow chart depicting an example process for 600 for forming a MIM capacitor using a multi-step biasing power scheme. FIG. 6 is described in conjunction with FIGS. 7A-7D, which are cross-sectional views of a semiconductor device, which illustrate the semiconductor device at various stages of fabrication in accordance with some embodiments of the present disclosure of the example process 600. In some figures, some reference numbers of components or features illustrated therein may be omitted to avoid obscuring other components or features; this is for ease of depicting the figures.

The process 600 is merely an example, and is not intended to limit the present disclosure beyond what is explicitly recited in the claims. Additional steps may be provided before, during, and after example process 600, and some of the steps described can be moved, replaced, or eliminated for additional embodiments of example process 600. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 600, including any descriptions given with reference to the Figures are merely exemplary and are not intended to be limiting beyond what is specifically recited in the claims that follow.

At block 610, the example process 600 includes providing a substrate. The substrate includes a layer over which an electrode (e.g., TiN electrode) is to be formed. Referring to the example of FIG. 7A, in an embodiment after completion of block 610, a substrate is provided with a pre-MIM layer 702 over which an electrode (e.g., TiN electrode) is to be formed.

At block 620, the example process 600 includes forming, on the substrate, a first electrode (e.g., TiN electrode) having a varying density that increases from a first density level at a bottom surface of the first electrode, to a second density level that is higher than the first density level at an intermediary area within the first electrode, and to a third density level that is higher than the second density level at a top surface of the first electrode. In various embodiments, the forming the first electrode comprises depositing the first electrode via plasma-based physical vapor deposition (PVD) techniques using a power source to cause magnetron sputtering (such as a DC sputtering power source, an RF Sputtering power source, a Pulsed DC sputtering power source, an MF sputtering power source, an AC sputtering power source, and a high power impulse magnetron sputtering (HiPIMS) power source) at increasing sputtering yields as the magnetron sputtering continues. In various embodiments, the magnetron sputtering comprises systematically increasing bias power to bombard target material to sputter atoms of the target material using a bias power scheme that causes the bias power to increase from a first power level that causes an initial sputtering yield to a higher power level that causes a desired sputtering yield that is higher than the initial sputtering yield. In various embodiments, the bias power scheme comprises one or more of applying step increases to increase the bias power, ramping up the bias power in a linear manner, and/or increasing the bias power in an exponential manner.

In various embodiments, the bias power scheme is controlled to achieve desired mechanical properties, desired electrical properties, desired uniformity properties, or desired conformity properties. In various embodiments, desired mechanical properties may include density, microstructure changes in the form of desired roughness, grain size, crystal alignment. In various embodiments, desired electrical properties may include resistivity or plate resistance. In various embodiments, desired conformity properties may include sidewall angle magnitude. In various embodiments, desired uniformity properties may include within wafer thickness uniformity, thickness range, sheet resistance uniformity, and sheet resistance range.

Figure 7A:
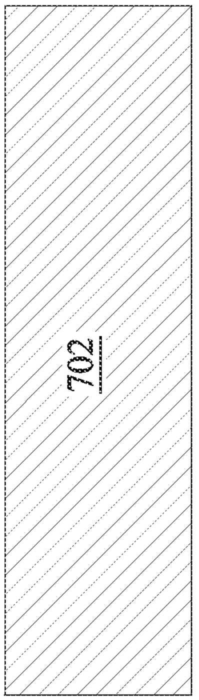
FIGS. 7A-7D, are cross-sectional views of a semiconductor device, which illustrate the semiconductor device at various stages of fabrication, in accordance with various embodiments.
Figure 7B:
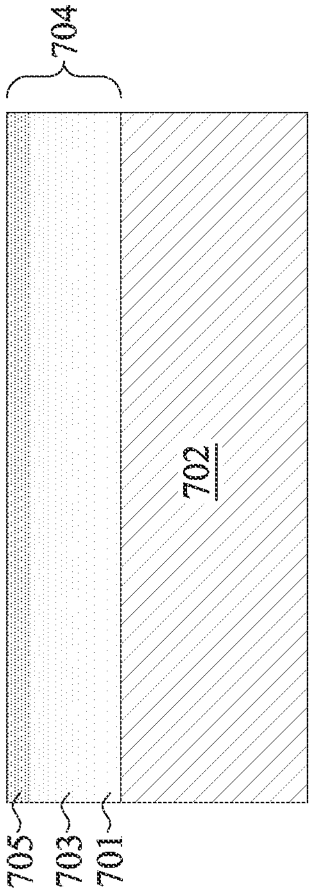
Figure 7C:
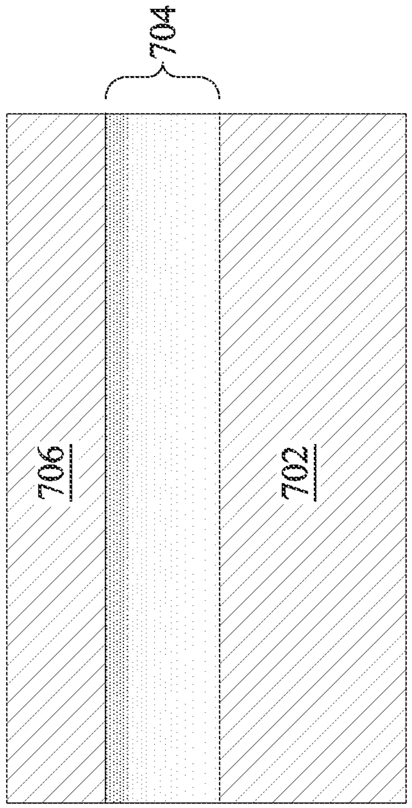

Referring to the example of FIG. 7B, in an embodiment after completion of block 620, a substrate is provided with a pre-MIM layer 702 over which an electrode 704 (e.g., TiN electrode) is formed. The electrode 704 has varying density that increases from a first density level at a bottom surface 701 of the first electrode, to a second density level that is higher than the first density level at an intermediary area 703 within the first electrode, and to a third density level that is higher than the second density level at a top surface 705 of the first electrode.

At block 630, the example process 600 includes forming a high-K dielectric layer over the first electrode. Referring to the example of FIG. 7C, in an embodiment after completion of block 630, a high-K dielectric layer 706 has been formed over which the electrode 704. The high-K dielectric layer 706 may be formed by appropriate deposition techniques, such as PVD.

At block 640, the example process 600 includes forming a second electrode over the HK dielectric layer having a varying density that increases from a fourth density level at a bottom surface of the second electrode that bonds to the HK dielectric layer, to a fifth density level that is higher than the fourth density level at an intermediary area within the second electrode, and to a sixth density level that is higher than the fifth density level at a top surface of the second electrode. In various embodiments, the forming the second electrode comprises depositing the second electrode via plasma-based physical vapor deposition (PVD) techniques using a power source to cause magnetron sputtering (such as a DC sputtering power source, an RF Sputtering power source, a Pulsed DC sputtering power source, an MF sputtering power source, an AC sputtering power source, and a high power impulse magnetron sputtering (HiPIMS) power source) at increasing sputtering yields as the magnetron sputtering continues. In various embodiments, the magnetron sputtering comprises systematically increasing bias power to bombard target material to sputter atoms of the target material using a bias power scheme that causes the bias power to increase from a first power level that causes an initial sputtering yield to a higher power level that causes a desired sputtering yield that is higher than the initial sputtering yield. In various embodiments, the bias power scheme comprises one or more of applying step increases to increase the bias power, ramping up the bias power in a linear manner, and/or increasing the bias power in an exponential manner.

In various embodiments, the first density level is equal to the fourth density level, the second density level is equal to the fifth density level, and the third density level is equal to the sixth density level. In other embodiments, the first density level is not equal to the fourth density level, the second density level is not equal to the fifth density level, and/or the third density level is not equal to the sixth density level. In various embodiments, the bias power scheme is controlled to achieve desired mechanical properties, desired electrical properties, desired uniformity properties, or desired conformity properties.

Figure 7D:
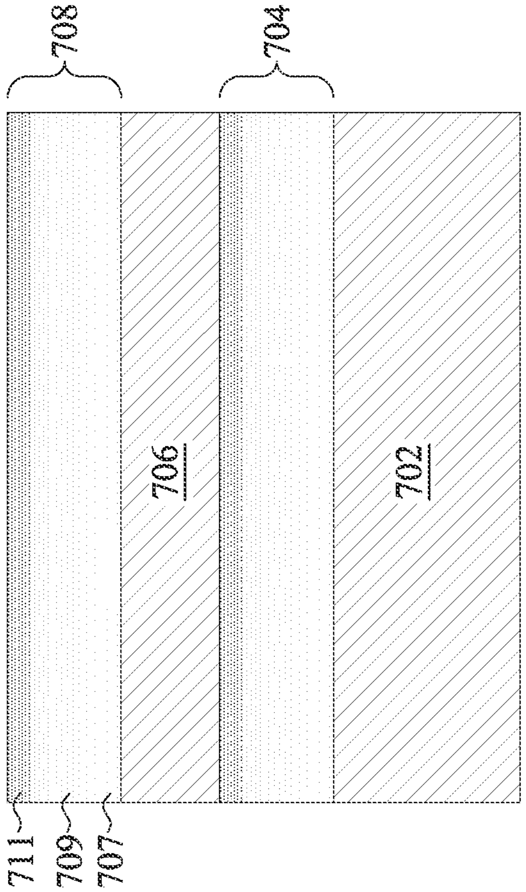

Referring to the example of FIG. 7D, in an embodiment after completion of block 640, an electrode 708 (e.g., TiN layer) is formed over the high-K dielectric layer 706. The electrode 708 has varying density that increases from a first density level at a bottom surface 707 of the second electrode, to a second density level that is higher than the first density level at an intermediary area 709 within the second electrode, and to a third density level that is higher than the second density level at a top surface 711 of the second electrode.

At block 650, the example process 600 includes performing further fabrication operations. A semiconductor device may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the process 600, and some process steps described above may be replaced or eliminated in accordance with various embodiments of the process 600.

Although the foregoing examples were illustrated with respect to the formation of a MIM capacitor and a TiN material/high-K material interface in a MIM capacitor, the foregoing apparatus, devices, and methods may also be used in connection with other material layer interfaces. For example, the multi-stage bias powering scheme may be used for depositing material other than TIN. Also, the multi-stage bias powering scheme may be used for depositing TiN material in other applications such as a VIA structure, an interdiffusion barrier layer, and a metal hardmask where protection from intermixing and interdiffusion could be helpful.

In some aspects, the techniques described herein relate to a fabrication method, including: forming, above a substrate, a first electrode having a varying density that increases from a first density level at a bottom surface of the first electrode to a second density level that is higher than the first density level at a top surface of the first electrode; forming a high-K (HK) dielectric layer over the first electrode; and forming a second electrode over the HK dielectric layer having a varying density that increases from a third density level at a bottom surface of the second electrode that bonds to the HK dielectric layer to a fourth density level that is higher than the third density level at a top surface of the second electrode.

In some aspects, the techniques described herein relate to a fabrication method, wherein: forming the first electrode includes forming the first electrode having a varying density that increases from the first density level at the bottom surface of the first electrode, to an first intermediate density level that is higher than the first density level at an intermediary area within the first electrode, and to the second density level that is higher than the first intermediate density level at the top surface of the first electrode; and forming the second electrode includes forming the second electrode having a varying density that increases from the third density level at the bottom surface of the second electrode that bonds to the HK dielectric layer, to a second intermediate density level that is higher than the third density level at an intermediary area within the second electrode, and to the fourth density level that is higher than the second intermediate density level at the top surface of the second electrode.

In some aspects, the techniques described herein relate to a fabrication method, wherein the first density level is equal to the third density level, the first intermediate density level is equal to the second intermediate density level, and the second density level is equal to the fourth density level.

In some aspects, the techniques described herein relate to a fabrication method, wherein forming the first electrode and the second electrode includes depositing a first Titanium nitride (TiN) electrode and a second TiN electrode via plasma-based physical vapor deposition (PVD) techniques using a power source to cause magnetron sputtering.

In some aspects, the techniques described herein relate to a fabrication method, wherein the magnetron sputtering includes systematically increasing bias power to bombard target material to sputter atoms of the target material using a bias power scheme that causes the bias power to increase from a first power level that causes an initial sputtering yield to a higher power level that causes a desired sputtering yield that is higher than the initial sputtering yield.

In some aspects, the techniques described herein relate to a fabrication method, wherein the bias power scheme includes applying step increases to increase the bias power.

In some aspects, the techniques described herein relate to a fabrication method, wherein the bias power scheme includes ramping up the bias power in a linear manner.

In some aspects, the techniques described herein relate to a fabrication method, wherein the bias power scheme includes increasing the bias power in an exponential manner.

In some aspects, the techniques described herein relate to a semiconductor device, including: a substrate; a first Titanium nitride (TiN) electrode formed above the substrate, the first TiN electrode having a varying density that increases from a first density level at a bottom surface of the first TiN electrode to a second density level that is higher than the first density level at a top surface of the first TIN electrode; a high-K (HK) dielectric layer formed over the first TIN electrode; and a second TiN electrode over the HK dielectric layer having a varying density that increases from a third density level at a bottom surface of the second TiN electrode that bonds to the HK dielectric layer to a fourth density level that is higher than the third density level at a top surface of the second TiN electrode.

In some aspects, the techniques described herein relate to a semiconductor device, wherein: the varying density of the first TiN electrode increases from the first density level at the bottom surface of the first TiN electrode, to an first intermediate density level that is higher than the first density level at an intermediary area within the first TiN electrode, and to the second density level that is higher than the first intermediate density level at the top surface of the first TiN electrode; and the varying density of the second TiN electrode increases from the third density level at the bottom surface of the second TiN electrode, to a second intermediate density level that is higher than the third density level at an intermediary area within the second TiN electrode, and to the fourth density level that is higher than the second intermediate density level at the top surface of the second TiN electrode.

In some aspects, the techniques described herein relate to a semiconductor device, wherein the first density level is equal to the third density level, the first intermediate density level is equal to the second intermediate density level, and the second density level is equal to the fourth density level.

In some aspects, the techniques described herein relate to a semiconductor device, wherein the first TiN electrode and the second TiN electrode were formed via plasma-based physical vapor deposition (PVD) techniques using a power source to cause magnetron sputtering.

In some aspects, the techniques described herein relate to a semiconductor device, wherein the power source for the plasma-based PVD techniques to cause magnetron sputtering includes a DC sputtering power source, an RF Sputtering power source, a Pulsed DC sputtering power source, an MF sputtering power source, an AC sputtering power source, or a high power impulse magnetron sputtering (HiPIMS) power source.

In some aspects, the techniques described herein relate to a semiconductor device, wherein the first TiN electrode and the second TIN electrode were formed via magnetron sputtering with bias power systematically increased to bombard target material to sputter atoms of the target material using a bias power scheme that caused the bias power to increase from a first power level that caused the first and third density levels, to a second power level that caused the second and fourth density levels.

In some aspects, the techniques described herein relate to a semiconductor device, wherein the bias power scheme includes step increases to increase the bias power.

In some aspects, the techniques described herein relate to a semiconductor device, wherein the bias power scheme includes a linear ramping up of the bias power.

In some aspects, the techniques described herein relate to a fabrication method, including: depositing, on a substrate via plasma-based physical vapor deposition (PVD) techniques using a power source to cause magnetron sputtering, a first Titanium nitride (TiN) electrode having a varying density that increases from a first density level at a bottom surface of the first TiN electrode, to a second density level that is higher than the first density level at an intermediary area within the first TiN electrode, and to a third density level that is higher than the second density level at a top surface of the first TiN electrode; forming a high-K (HK) dielectric layer over the first TiN electrode; and depositing, via magnetron sputtering, a second TiN electrode over the HK dielectric layer having a varying density that increases from the first density level at a bottom surface of the second TiN electrode that bonds to the HK dielectric layer, to the second density level that is higher than the first density level at an intermediary area within the second TIN electrode, and to the third density level that is higher than the second density level at a top surface of the second TiN electrode; wherein the magnetron sputtering includes systematically increasing bias power to bombard target material to sputter atoms of the target material using a bias power scheme that causes the bias power to increase from a first power level that is high enough to cause sputtering to a higher power level that causes a desired sputtering yield.

In some aspects, the techniques described herein relate to a fabrication method, wherein the bias power scheme includes applying step increases to increase the bias power.

In some aspects, the techniques described herein relate to a fabrication method, wherein the bias power scheme includes ramping up the bias power in a linear manner.

In some aspects, the techniques described herein relate to a fabrication method, wherein the bias power scheme includes increasing the bias power in an exponential manner.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A fabrication method, comprising:

forming via sputtering, above a substrate, a first electrode using a first varying bias power scheme that increases from a first power level applied to deposit a first layer of the first electrode at a bottom surface of the first electrode to a second power level that is higher than the first power level applied to deposit a second layer of the first electrode at a top surface of the first electrode;

forming a high-K (HK) dielectric layer over the first electrode; and forming via sputtering a second electrode over the HK dielectric layer using a second varying bias power scheme that increases from a third power level applied to deposit a first layer of the second electrode at a bottom surface of the second electrode that bonds to the HK dielectric layer to a fourth power level that is higher than the third power level applied to deposit a second layer of the second electrode at a top surface of the second electrode.

2. The fabrication method of claim 1, wherein:

the first varying bias power scheme further comprises a first intermediate power level that is higher than the first power level and lower than the second power level and is applied to deposit an intermediate layer of the first electrode at an intermediary area within the first electrode; and the second varying bias power scheme further comprises a second intermediate power level that is higher than the third power level and lower than the fourth power level and is applied to deposit an intermediate layer of the second electrode at an intermediary area within the second electrode.

3. The fabrication method of claim 2, wherein the first power level is equal to the third power level, the first intermediate power level is equal to the second intermediate power level, and the second power level is equal to the fourth power level.

4. The fabrication method of claim 1, wherein forming the first electrode and the second electrode comprises depositing a first Titanium nitride (TiN) electrode and a second TiN electrode via plasma-based physical vapor deposition (PVD) techniques using a power source to cause magnetron sputtering.

5. The fabrication method of claim 4, wherein the magnetron sputtering comprises systematically increasing bias power to bombard target material to sputter atoms of the target material using a bias power scheme that causes the bias power to increase from the first power level that causes an initial sputtering yield to a higher power level that causes a desired sputtering yield that is higher than the initial sputtering yield.

6. The fabrication method of claim 5, wherein the bias power scheme comprises applying step increases to increase the bias power.

7. The fabrication method of claim 5, wherein the bias power scheme comprises ramping up the bias power in a linear manner.

8. The fabrication method of claim 5, wherein the bias power scheme comprises increasing the bias power in an exponential manner.

9. A fabrication method, comprising:

depositing, on a substrate via plasma-based physical vapor deposition (PVD) techniques using a power source to cause magnetron sputtering, a first Titanium nitride (TiN) electrode using a varying bias power scheme that increases from a first power level when depositing a first layer at a bottom surface of the first TiN electrode, to a second power level that is higher than the first power level when depositing a second layer at an intermediary area within the first TiN electrode, and to a third power level that is higher than the second power level when depositing a third layer at a top surface of the first TiN electrode;

forming a high-K (HK) dielectric layer over the first TiN electrode; and depositing, via magnetron sputtering, a second TiN electrode over the HK dielectric layer using the varying bias power scheme that increases from the first power level when depositing a first layer at a bottom surface of the second TiN electrode that bonds to the HK dielectric layer, to the second power level when depositing a second layer at an intermediary area within the second TiN electrode, and to the third power level when depositing a third layer at a top surface of the second TiN electrode;

wherein the magnetron sputtering comprises systematically increasing bias power to bombard target material to sputter atoms of the target material using a bias power scheme that causes the bias power to increase from a first power level that is high enough to cause sputtering to a higher power level that causes a desired sputtering yield.

10. The fabrication method of claim 9, wherein the bias power scheme comprises applying step increases to increase the bias power.

11. The fabrication method of claim 9, wherein the bias power scheme comprises ramping up the bias power in a linear manner.

12. The fabrication method of claim 9, wherein the bias power scheme comprises increasing the bias power in an exponential manner.

13. A method, comprising:

depositing, on a substrate via sputtering, a first Titanium nitride (TiN) electrode by applying a first bias power level during a first time period to form a first area of the first TiN electrode and applying a second bias power level that is higher than the first bias power level during a second time period to form a second area of the first TiN electrode;

forming a high-K (HK) dielectric layer over the first TiN electrode; and depositing a second TiN electrode over the HK dielectric layer via sputtering by applying a third bias power level during a third time period to form a first area of the second TiN electrode that bonds to the HK dielectric layer and applying a fourth bias power level that is higher than the third bias power level during a fourth time period to form a second area of the second TiN electrode.

14. The method of claim 13, wherein:

depositing the first TiN electrode further comprises applying a first intermediate bias power level that is higher than the first bias power level and lower than the second bias power level during a first intermediate time period to form a first intermediary area within the first TIN electrode; and depositing the second TiN electrode further comprises applying a second intermediate bias power level that is higher than the third bias power level and lower than the fourth bias power level during a second intermediate time period to form a second intermediary area within the second TiN electrode.

15. The method of claim 14, wherein the first bias power level is equal to the third bias power level, the first intermediate bias power level is equal to the second intermediate bias power level, and the second bias power level is equal to the fourth bias power level.

16. The method of claim 13, wherein depositing the first TiN electrode and depositing the second TiN electrode comprises depositing the first TiN electrode and depositing the second TiN electrode via plasma-based physical vapor deposition (PVD) techniques using a power source to cause magnetron sputtering.

17. The method of claim 16, wherein the power source for the plasma-based PVD techniques to cause magnetron sputtering comprises a DC sputtering power source, an RF Sputtering power source, a Pulsed DC sputtering power source, an MF sputtering power source, an AC sputtering power source, or a high power impulse magnetron sputtering (HiPIMS) power source.

18. The method of claim 13, wherein depositing the first TIN electrode and the second TiN electrode comprises applying a plurality of bias power levels that increase in an exponential manner from one time period to a next time period.

19. The method of claim 13, wherein depositing the first TIN electrode and the second TiN electrode comprises applying a plurality of bias power levels that increase in a stepwise manner from one time period to a next time period.

20. The method of claim 13, wherein depositing the first TIN electrode and the second TiN electrode comprises applying a plurality of bias power levels that increase linearly from one time period to a next time period.

* * * * *